United States Patent
Campbell et al.

[11] Patent Number: 5,978,400
[45] Date of Patent: Nov. 2, 1999

[54] LASER

[75] Inventors: Robert John Campbell, Belfast, Ireland; Richard Wyatt, Felixstowe, United Kingdom; Gerard Sherlock, Ipswich, Ireland; Jonathan Richard Armitage, Ipswich, United Kingdom; Michael Charles Brierley, Ipswich, United Kingdom; Roger Alyn Payne, Ipswich, United Kingdom; Douglas Williams, Stowmarket, United Kingdom; Michael James Robertson, Ipswich, United Kingdom; Howard John Wickes, Colchester, United Kingdom

[73] Assignee: British Telecommunications public limited company, London, United Kingdom

[21] Appl. No.: 08/913,002

[22] PCT Filed: Mar. 7, 1996

[86] PCT No.: PCT/GB96/00530

§ 371 Date: Nov. 19, 1997

§ 102(e) Date: Nov. 19, 1997

[87] PCT Pub. No.: WO96/27929

PCT Pub. Date: Sep. 12, 1996

[51] Int. Cl.$^6$ .................................................. H02S 3/10
[52] U.S. Cl. ............................... 372/46; 372/96; 372/102
[58] Field of Search ................................. 372/46, 92, 96, 372/102

[56] References Cited

U.S. PATENT DOCUMENTS 4,821,277  4/1989  Alphonse et al. ........................ 372/45
5,715,263  2/1998  Trudo et al. ............................. 372/6

FOREIGN PATENT DOCUMENTS 0 246 793  11/1987  European Pat. Off. .
0 318 947  6/1989   European Pat. Off. .
37 16 191  11/1987  Germany .

OTHER PUBLICATIONS

*Electronics Letters*, vol. 24, No. 23, Nov. 10, 1988, pp. 1439–1441, Burns et al "Active Mode–Locking of an External Cavity GaInAsP Laser Incorporating a Fibre–Grating Reflector".

*Electronics Letters*, vol. 25, No. 4, Feb. 16, 1989, pp. 270–272; Bachen et al "External Cavity Semiconductor Laser Comprising Brewster–Angled Rectangular Core Fibre".

*Electronics Letters*, vol. 30, No. 11, May 26, 1994, pp. 857–859, Lealman et al "1.56μm InGaAsP/InP Tapered Active Layer Multiquantum Well Laser with Improved Coupling to Cleaved Singlemode Fiber".

*Primary Examiner*—James W. Davie
*Attorney, Agent, or Firm*—Nixon & Vanderhye P.C.

[57] ABSTRACT

A laser includes first and second feedback elements defining a laser cavity, and a gain medium within the laser cavity. The gain medium has first and second facets and an optical waveguide for guiding optical radiation between said first and second facets. The second feedback element is wavelength selective, and the optical waveguide is configured to direct optical radiation at an angle θ to the normal of the second facet.

18 Claims, 8 Drawing Sheets

LASING MODE AT TEMP

LASER

BACKGROUND OF HE INVENTION

1. Field of the Invention

The present invention relates to a laser.

2. Related Art

There is a requirement, for example in optical telecommunications networks, for lasers having a narrow linewidth output. Such lasers can be used in, for example, wavelength division multiplex systems where closely spaced, different wavelengths are utilised to carry different communications channels, or in high bit rate systems which require narrow linewidth optical sources in order to avoid the effects of dispersion. DFB (distributed feedback) semiconductor lasers, having a diffraction grating within the semiconductor gain material, have been utilised for these applications. A disadvantage of these DFB lasers is that, due to the temperature dependence of the refractive index of the semiconductor material, their output wavelength varies as their temperature varies. This generally necessitates the use of a temperature controller, and associated electronics, to stabilise the temperature, and thus output wavelength, of DFB lasers.

This problem has been overcome, to some extent, in fibre grating lasers (FGL), in which a lensed fibre, comprising a fibre grating, is aligned with a semiconductor laser diode to form a short external cavity laser, see for example "Narrow Line Semiconductor Laser Using Fibre Grating", Bird et al, Electronics Letters, Jun. 20, 1991, Vol. 27, No. 13, pp1115–1116. In this device, the laser diode facet closest to the lensed fibre end is anti-reflection coated so that lasing occurs between the back facet of the laser diode and the grating within the fibre. Since the majority of the laser cavity, including the grating, is now within the fibre, rather than the semiconductor material, the change in output wavelength of the FGL, with temperature, is far lower than that of a DFB laser.

The present applicants have found that known FGLs are not suitable for use in practical optical telecommunication networks due lo instabilities in both their output wavelength, and their output power, as either the drive current, or the temperature, of the FGL is varied.

SUMMARY OF THE INVENTION

According to the present invention, there is provided a laser comprising first and second feedback elements defining a laser cavity, and a gain medium within the laser cavity, the gain medium having first and second facets and an optical waveguide for guiding optical radiation between said first and second facets, wherein the second feedback element is wavelength selective, the optical waveguide comprises a curved section and is configured to direct optical radiation at an angle to the normal of the second facet, and wherein the optical waveguide is additionally configured to direct optical radiation substantially parallel to the normal of the first facet.

The present applicant has discovered that the instabilities of known FGLs are due to coupled cavities being formed between the back and front (i.e. closest to the fibre) facets of the semiconductor laser diode, and between the fibre grating and the front facet. The instabilities in the output of known FGLs are thought to be due to mode competition between these various coupled cavities. This mode competition renders known FGLs unusable in practical situations, despite anti-reflection coatings applied to the front facet of the semiconductor laser diode. A particular problem seen when prior art FGLs are employed in systems to transmit data is that severe mode hopping between the modes of the coupled cavities causes a degradation in the BER (bit error rate) performance of the system, due to consequent large changes in output power.

The use of angled facets is known from, inter alia, Electronics Letters, Vol24, 1988, No.23, pp 1439–1441. In that latter a diode amplifier of ridge waveguide configuration has its ridge positioned at an angle of 10° with respect to the facet normal "to frustrate the internal resonances evident in cleaved facet semiconductor lasers", The device is used with two external reflectors, a mirror and a grating etched into an optical fibre. The laser is designed for active mode-locking.

The use of angled facets to suppress Fabry Perot modes is also known from the somewhat remote technical field of superluminescent diodes (which deliberately have very short coherence lengths, typically 50 $\mu$m, unlike semiconductor lasers (such as in the present invention) which typically have coherence lengths of about 2 cm).

The present invention seeks to overcome, or at least to mitigate to some extent, these problems, by providing an optical waveguide which directs optical radiation at an angle to the normal of the front facet of the gain medium of a laser. The effect of providing an angle between the optical waveguide and the normal to the front facet ia that the effective reflection from this front facet is reduced. A further advantage, stemming from the optical radiation being directed at an angle to the normal of the front facet, is that the reflection from this front facet is likely to be polarisation sensitive. That is, the reflectivity of the facet for orthogonally polarised modes of the optical waveguide is likely to be different. This has been found to be beneficial in lasers according to the present invention since it aids lasing of the laser in only one mode.

Preferably, the optical waveguide is additionally configured to direct optical radiation substantially parallel to the normal of the first facet. This is particularly advantageous when the first feedback element is provided by the first facet of the gain medium, since in this case the required high reflectivity from this first (or back) facet can be easily provided, for example simply from the fresnel reflection between, for example, a semiconductor/air interface. It is also possible to enhance the reflectivity of this facet with an appropriate coating.

Preferably the path of the optical waveguide comprises a curved section. This curved section advantageously enables the optical waveguide to be substantially parallel to the normal of the first facet, while also meeting the second facet at an angle to its normal. This is particularly advantageous when the two facets are parallel.

Preferably the angle between the optical waveguide and the normal of the second facet is greater than 5°. More preferably, this angle is greater than 10°, and most preferably this angle is approximately 12°.

Preferably the radius of curvature of the curved section of the optical waveguide is between 0.3 mm and 1 mm. The applicants have found that this range of radii for the optical waveguide, in practical semiconductor devices, represents an appropriate balance between the conflicting requirements of providing a reasonably large angle at the first facet, avoiding waveguide loss in the curved section of the optical waveguide, and providing a gain medium of reasonable length.

Although the end of an optical fibre, in which a grating provides the second, wavelength selective, feedback element, can comprise a lens, preferably this fibre end is cleaved. A cleaved fibre end relaxes the alignment tolerances in aligning the fibre with the gain medium. More preferably the fibre is cleaved so that the normal to the plane of the cleave is at an angle to the fibre axis.

Preferably the alignment tolerances between the gain medium and the second, wavelength selective, feedback element are further relaxed by the use of an optical waveguiding structure within the gain medium which modifies the size of a mode of the waveguide as it propagates from the first facet to the second facet of the gain medium. Preferably, the optical waveguide comprises a waveguiding structure as described, and claimed, in the applicants co-pending application relating to a large spot size laser, filed on Feb. 25, 1995, application no. PCT GB95/00387. This application is incorporated herein by reference.

In addition to the polarisation sensitivity of lasers according to the present invention due to the angle the optical waveguide makes with the front facet of the gain medium, preferably polarisation sensitivity is further enhanced by dimensioning the optical waveguide so as to provide more gain to a mode in one polarisation than to modes in other polarisations.

BRIEF DESCRIPTION OF THE DRAWINGS

Embodiments of the present invention will now be described, by way of example only, and reference to the following figures, in which.

DETAILED DESCRIPTION OF EXEMPLARY EMBODIMENTS

Figure 1:
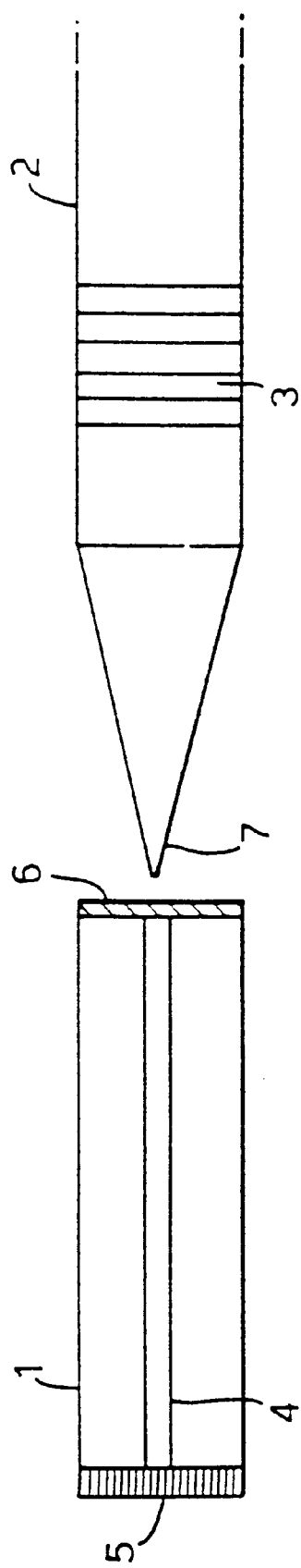
FIG. 1 is a schematic representation of a prior art FGL.
Figure 2:
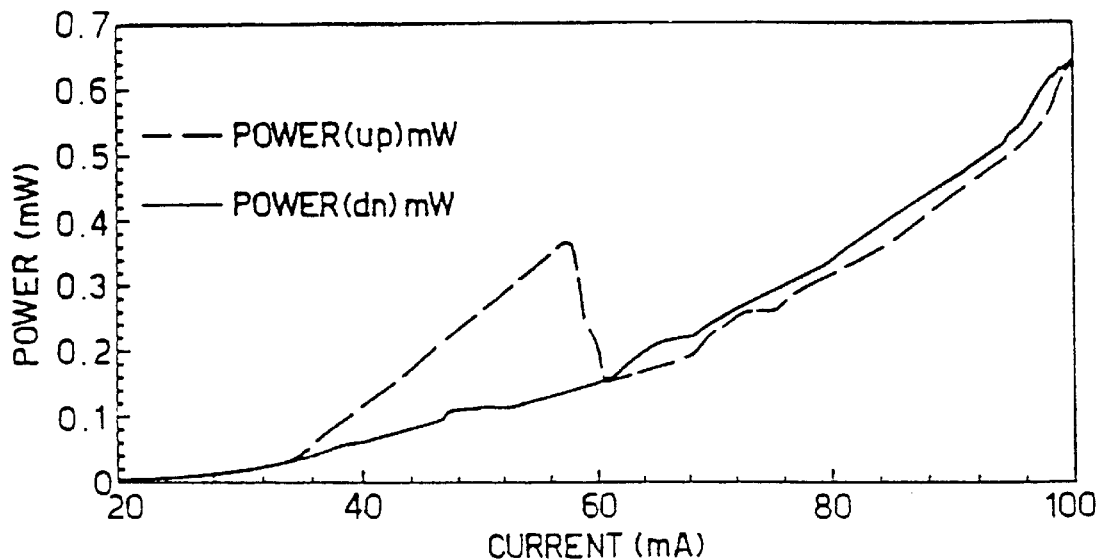
FIG. 2 is an experimental graph showing the LI characteristic of a prior art FGL having a fibre grating with an overall length of approximately 1 cm and a bandwidth of 0.2 nm, and a semiconductor laser diode of 500 $\mu$m length.

FIG. 1 is a schematic diagram of a prior art FGL, comprising a semiconductor laser diode 1 aligned to an optical fibre 2, having a UV written fibre grating 3. The semiconductor laser diode 1 comprises an optical waveguide 4 for directing optical radiation between its back facet 5 and its front facet 6. The back facet 5 may be coated with a high reflectivity multi-layer dielectric coating in order to increase its reflectivity beyond the fresnel reflection for a semiconductor/air interface. The front facet 6 of the semiconductor laser diode 1 is coated with a multi-layer dielectric anti-reflection coating. The optical fibre 2 comprises a tapered fibre lens 7 at its end adjacent the front facet 6 of the semiconductor laser diode 1. The lasing characteristics of such a prior art FGL are primarily determined by the wavelength, reflectivity and bandwidth of the fibre grating 3. However, the present applicant has discovered during experiments with these devices that the power/current (LI) characteristics of these prior art FGLs display mode hops of approximately 0.6 nm which occur periodically as either the current, or temperature of the FGL is varied. Such an experimental result is shown in FIG. 2, from which it can be seen that there is a large mode hop occurring during the increase in drive current to the FGL, although not during the reduction in drive current to the FGL. No temperature control was applied to the laser whilst the current was varied.

Device characteristics such as shown by FIG. 2 are not generally considered suitable for use in a telecommunications network for several reasons: these are (a) mode hops of around 0.5 nm would cause system management problems when used in WDM systems, (b) large variations in output power would require a higher power budget to be incorporated in the network design than is desirable and (c) hysteresis in the LI characteristics of devices are traditionally the hallmark of sub-standard lasers.

The reason for the mode hops in the LI characteristics have been identified by the present applicant as being caused by a coupled cavity being formed between the back and front facets of the semiconductor laser diode 1 and the fibre grating 3 and semiconductor front facet 6.

The mode hopping shown in FIG. 2 is present when operating prior art FGLs despite the provision of an anti-reflection coating on the front facet 6 of the semiconductor laser diode 1. The best achievable reflectivity when utilising anti-reflection coatings on semiconductor laser diodes is approximately $10^{-4}$, but even this degree of reflection suppression has been found to be insufficient to enable prior art FGLs to be utilised in telecommunication systems. A reflectivity of $10^{-4}$ is difficult to achieve, and is only achieved with a very low yield. A more typical value, that can be achieved with a somewhat higher yield, is $10^{-3}$. Details of suitable anti-reflection coatings can be found in the paper by G Eisenstein et al, in Applied Optics, Vol.23, No.1, pp 161–4, 1984.

Figure 3:
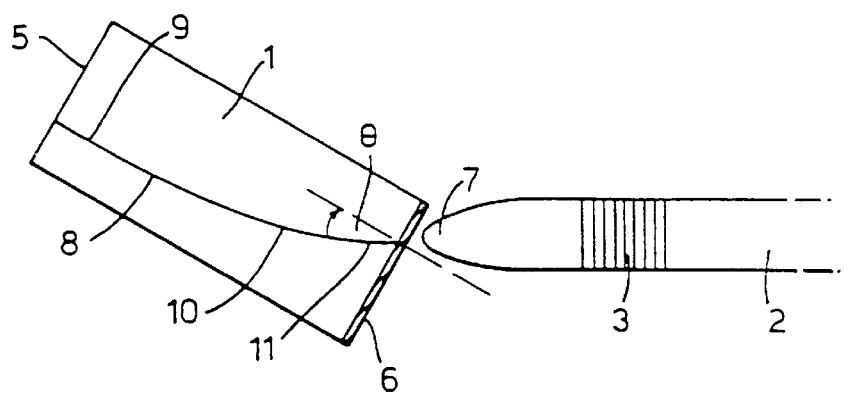
FIG. 3 shows a schematic diagram of an embodiment of the present invention.

FIG. 3 shows an FGL according to an embodiment of the present invention. The FGL comprises a semiconductor laser diode 1, having an AR coating on its front facet 6, and an optical fibre 2 having a fibre grating 3, and a tapered lens 7. The optical waveguide 8 of the semiconductor laser diode 1 comprises 3 sections, a straight section 9, which is substantially parallel to the normal of the back facet 5, a straight section 11, which forms an angle θ with the normal to the front facet 6, and a curved section 10 which joins the two straight sections 9 and 11.

The semiconductor laser diode 1 is fabricated employing standard MOVPE semiconductor growth, and masking, techniques. The processing schedule for the growth of the semiconductor laser diode is as follows, with reference to FIG. 4.

Figure 4A:
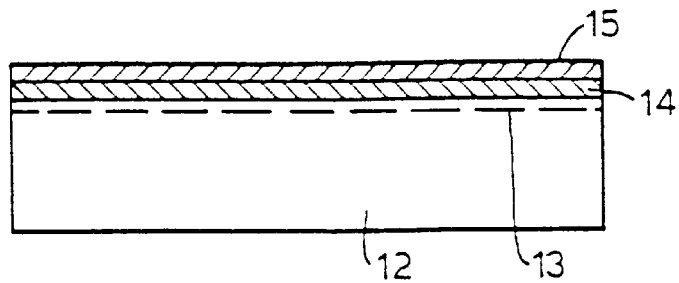
FIGS. 4a–4h are a schematic representation of the growth of a semiconductor laser diode according to an embodiment of the present invention.
Figure 4B:
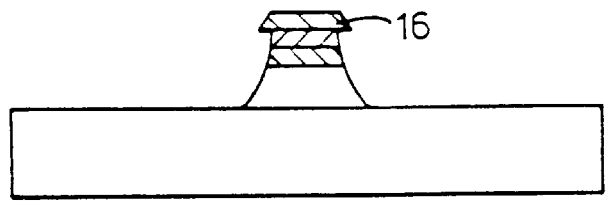
Figure 4C:
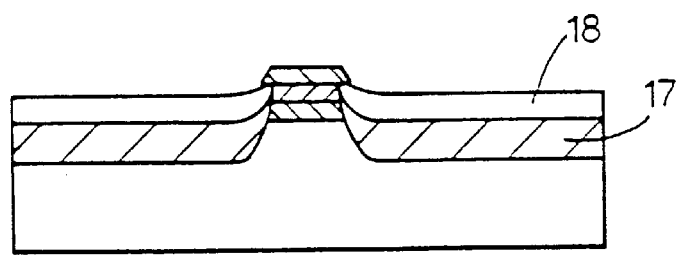
Figure 4D:
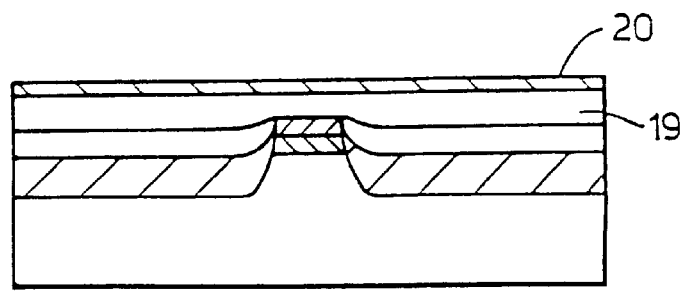
Figure 4E:
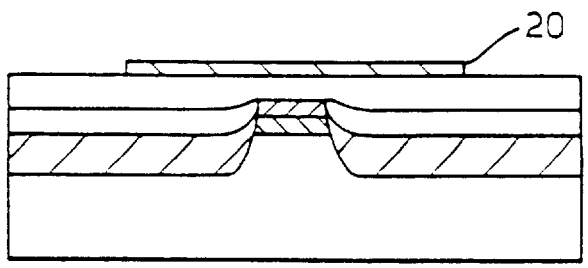
Figure 4F:
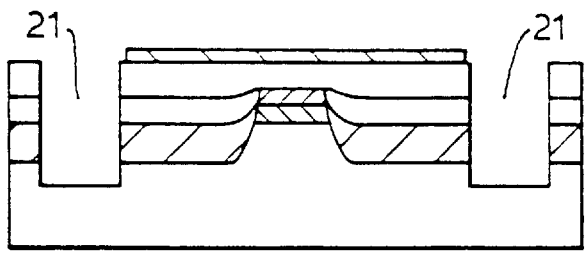
Figure 4G:
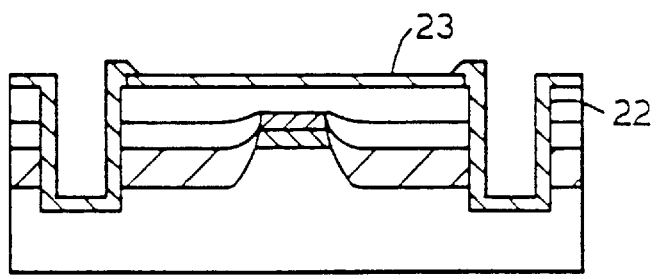
Figure 4H:
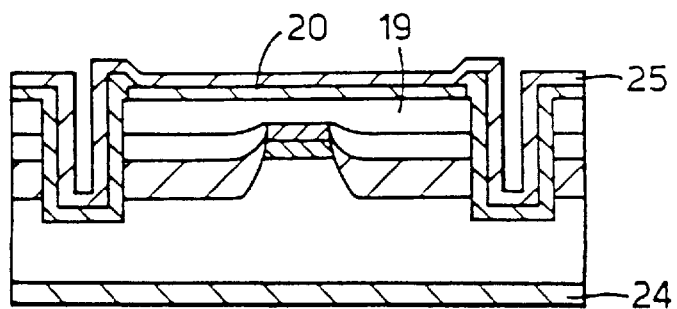

FIG. 4a depicts a planar wafer comprising an n-lnP substrate 12, a 2 $\mu$m thick InP buffer layer (S doping 3E18) 13, an undoped pQ 1.54 active layer 14 0.15 $\mu$m thick, and a capping layer 15 of pInP (doping Zn 4E17) 0.4 $\mu$m thick. This planar wafer is then masked in a conventional manner employing a mask designed to define a waveguide 8 which is aligned appropriately to the back facet 5 and front facet 6 of the semiconductor laser diode 1. With reference to FIG. 4b, following deposition of an $SiO_2$ layer 16 a mesa, corresponding to the waveguide 8 defined by masking, is etched employing conventional reactive ion etching. This mesa structure is then overgrown with a pInP blocking layer 17, of thickness 0.6 $\mu$m (doping Zn 6E17), and an nInP blocking layer 18 (doping S 9E17) of thickness 0.4 $\mu$m. With reference to FIG 4d, a second stage overgrowth is then carried out to form contact layers 19 and 20 of, respectively, p-InP, and p+InGaAs. Layer 19 is comprised of two layers of equal thickness (0.75 $\mu$m) having respectively doping levels of Zn 8E17, and Zn 2E18. Layer 20 is of thickness 0.1 $\mu$m and doping Zn 2E19. With reference to FIGS. 4e and 4f, the layer 20 is then masked and etched on either side of the waveguide, down to the substrate to form a trench 21 either side of the waveguide. The device is then coated in pyrox 22, and a contact window 23 is formed, in a conventional manner, as shown in FIG. 4g. Finally, with reference to FIG. 4h, the device is thinned, and metallised, with an n-contact TiAu contact 24 on the substrate, and a p-contact Ti/TiAu contact 25 on the top surface.

Other dimensions of the device are as follows:

Overall device width: ~200 $\mu$m

Overall device length: ~500 $\mu$m

Device thickness: ~90 $\mu$m (after thinning)

Width of active layer: ~1.67 $\mu$m

Width between trenches (inside to inside): ~20 $\mu$m

Width of trenches: ~5 $\mu$m

The front facet 6 of the semiconductor laser diode 1 is then AR coated, utilising multiple dielectric layers.

Figure 13:
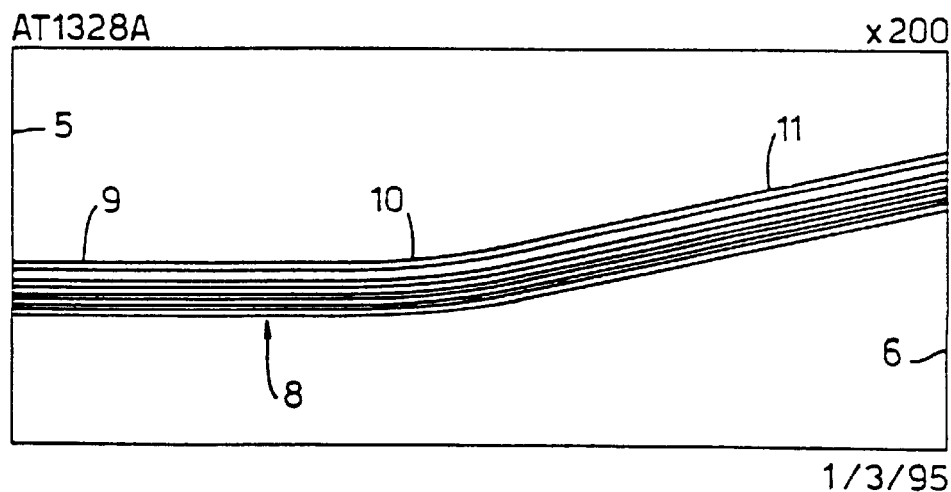
FIG. 13 is a copy of a photograph of a semiconductor laser diode according to an embodiment of the present invention.

FIG. 13 is a copy of a photograph of a semiconductor laser diode according to an embodiment of the present invention.

Figure 5:
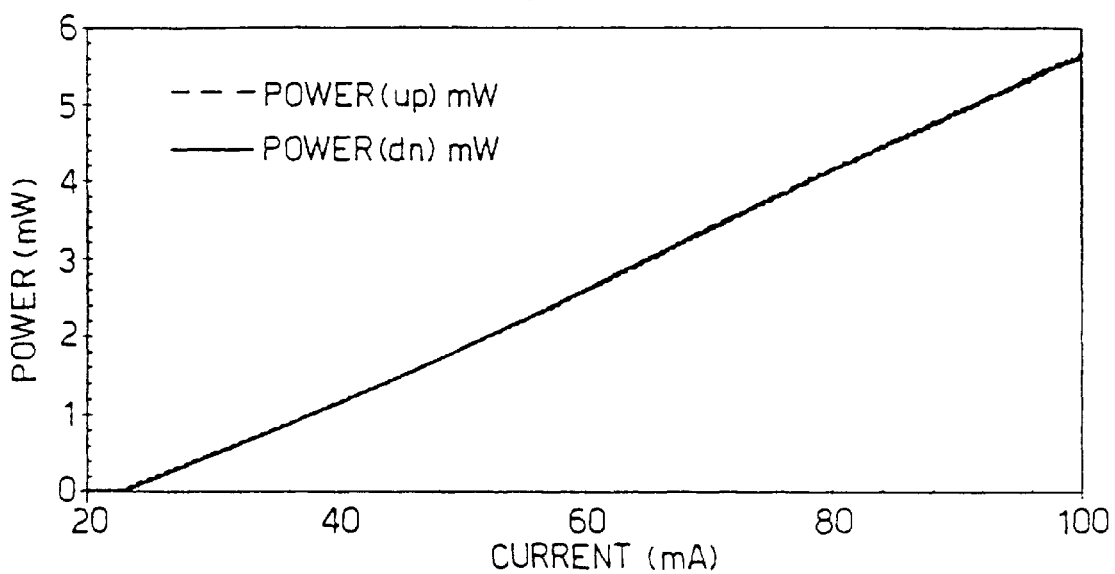
FIG. 5 shows the variation in output power of a laser according to an embodiment of the present invention, with drive current.
Figure 6:
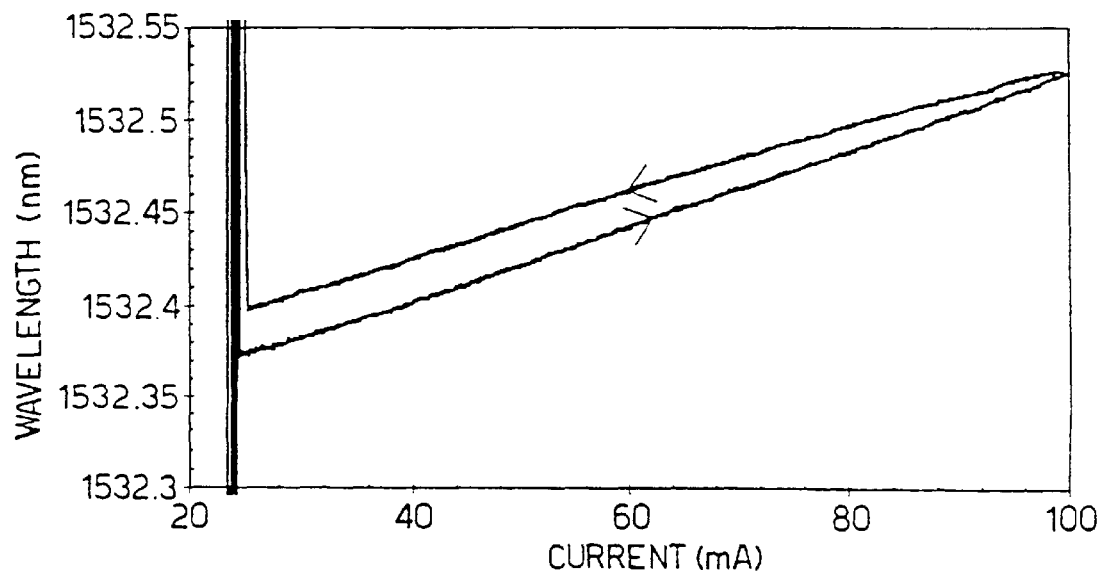
FIG. 6 shows the variation in output wavelength of a laser according to an embodiment of the present invention, with drive current.

The semiconductor laser diode 1, according to the present embodiment of the invention, is then coupled to an optical fibre 2 having a fibre grating 3 of reflectivity 24%, and bandwidth 0.2 nm. The total laser cavity length, i.e. the length from the fibre grating 3 to the back facet 5 of the semiconductor laser diode 1 is approximately 1 cm, corresponding to a free spectral range of 0.05 nm. The temperature uncontrolled power characteristics and wavelength variation of this laser are shown in FIGS. 5 and 6 respectively. From these figures it is clear that the use of a semiconductor laser diode having an optical waveguide which forms an angle to the normal of the front facet, results in a laser having more linear LI characteristics, and not suffering from mode hops or power fluctuations.

Figure 7:
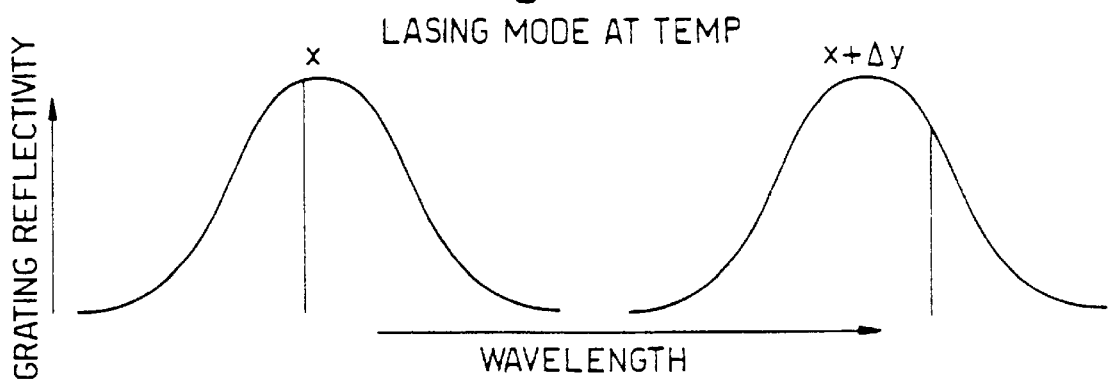
FIG. 7 is a schematic diagram showing the effect of a movement in lasing wavelength with temperature, across the reflectivity profile of a grating.

The slight variation of the LI curve shown in FIG. 5 from the expected linear response is thought to be caused by a temperature induced wavelength drift caused by the lasing wavelength moving across the grating. With reference to FIG. 7, as the wavelength moves across the grating reflectivity, the reflectivity changes, which alters the cavity properties i.e. cavity feedback and output coupling and as a result the output power of the laser varies.

Figure 8:
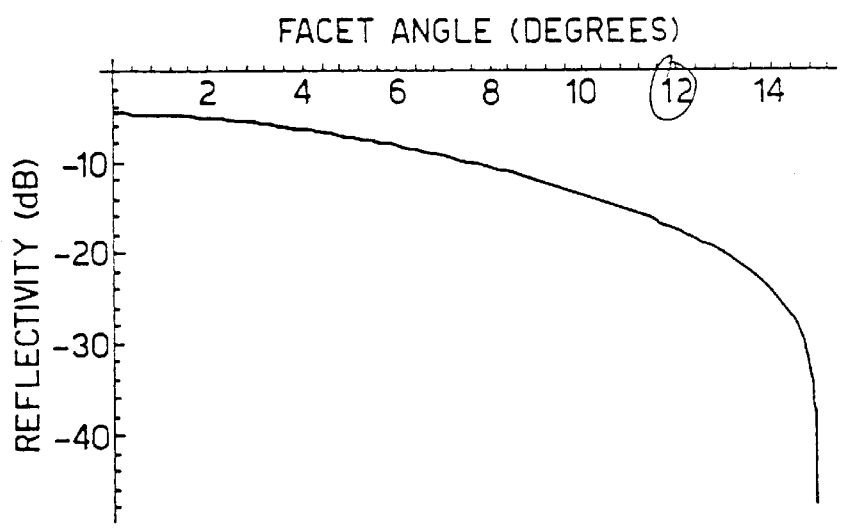
FIG. 8 is a theoretical graph showing the variation in reflectivity from the front facet of a semiconductor laser diode according to an embodiment of the present invention, as a function of the angle between the waveguide and the normal to the facet.

The experimental results shown in FIGS. 5 and 6 are for an FGL according to the present invention having an angle $\theta$ between the optical waveguide 11 and the front facet 6 of the semiconductor laser diode 1, of 12°. Devices having angles $\theta$ of 8°, 10°, 12° and 14° have been fabricated, and modelled theoretically. FIG. 8 shows a graph of the variation in reflectivity from the front facet as a function of the angle $\theta$ between the waveguide 11 and the normal to the front facet. This theoretical graph is based on a slab waveguide model. It has been found experimentally that the angle yielding best results is approximately 12°.

In order to estimate the reflectivity from the front facet of semiconductor laser diodes according to embodiments of the present invention the degree of wavelength ripple of the semiconductor laser diode, when operated as an amplifier, has been modelled theoretically, and measured experimentally.

Figure 9:
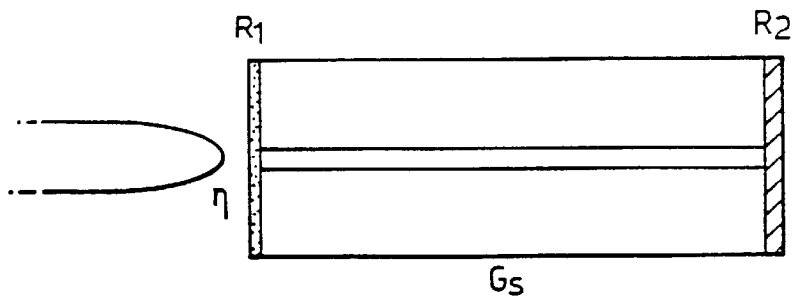
FIG. 9 is a schematic of a reflective amplifier.

The reflective amplifier is essentially a semiconductor amplifier with one very low facet reflectivity and one higher reflectivity mirror. It is illustrated schematically in FIG. 9.

Light is input through a single mode fibre to the device with efficiency $\eta$. The reflectivity of the input facet is $R_1$. The single pass gain of the amplifier is GB and the mirror reflectivity is $R_2$. It can be shown that the total reflective gain G of the amplifier is given by $$G = \frac{(\sqrt{R_1} - G_s\sqrt{R_2})^2 + 4G_s\sqrt{R_1}\,R_2\,\sin^2\Phi}{(1 - \sqrt{R_1\,R_2}\,G_s)^2 + 4G_s\sqrt{R_1}\,R_2\,\sin^2\Phi}$$

Where the phase term $\theta = 2 M L/(\lambda-\lambda_o)$, L is the cavity length. M the mode number (an integer), $\lambda$ the signal wavelength and $\lambda_o$ the wavelength of the nearest ripple peak. The etalon gain in this case is maximised when $\phi p=0,\pi$ and minimised with $\phi=\pi/2, 3\pi/2$. The dependency of G on $\pi$ gives rise to gain. The gain ripple is given by $$\partial G = \frac{(\sqrt{R_1} - G_s\sqrt{R_2})(1 + G_s\sqrt{R_1\,R_2})}{(\sqrt{R_1} + G_s\sqrt{R_2})(1 - G_s\sqrt{R_1\,R_2})}$$

Figure 10:
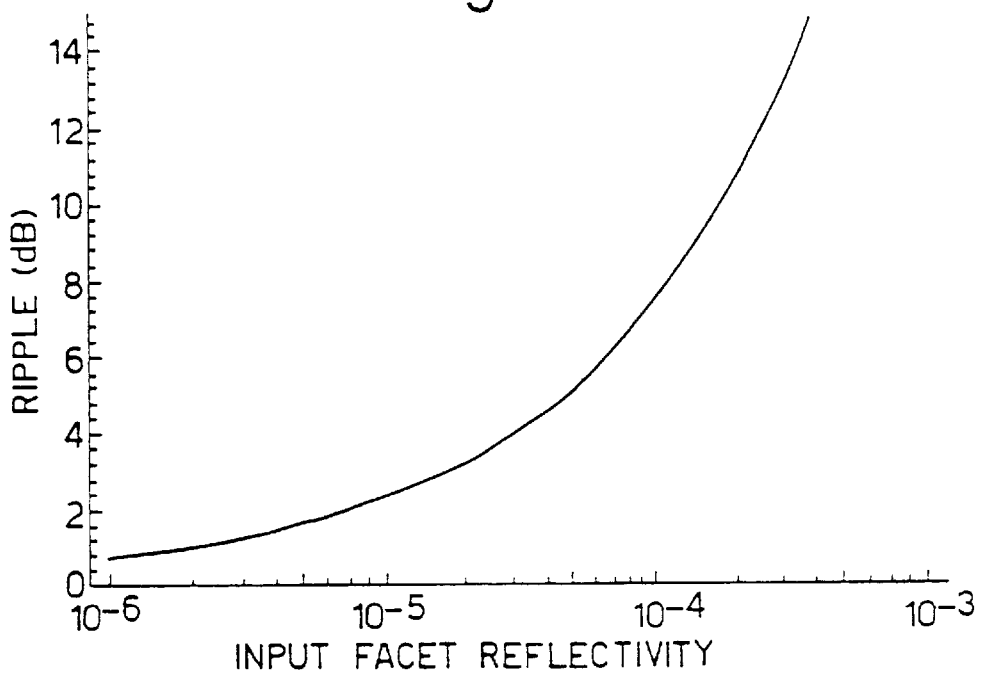
FIG. 10 shows a graph giving the dependence of wavelength gain ripple on the input facet reflectivity.

The variation in gain ripple with input reflectivity, for a device having a back facet reflectivity of 85%, and 20 dB fibre to fibre gain, has been plotted in FIG. 10.

By measuring the wavelength gain ripple of a semiconductor laser diode 1 according to embodiments of the present invention, when operated as a reflective amplifier, it is possible to estimate the reflectivity of the front facet. This has been estimated to be approximately $5-10^{-5}$.

The width of the optical waveguide 8 has been varied, in order to alter the polarisation sensitivity of the semiconductor laser diode 1. Widths of 1.2 $\mu$m, 1.44 $\mu$m, and 1.79 $\mu$m, have been fabricated. The devices having waveguide widths of 1.44 $\mu$m have been found to perform best, giving better polarisation selectivity than devices having smaller waveguide widths, and thus enhancing the singlemodedness of lasers according to embodiments of the present invention.

Figure 11:
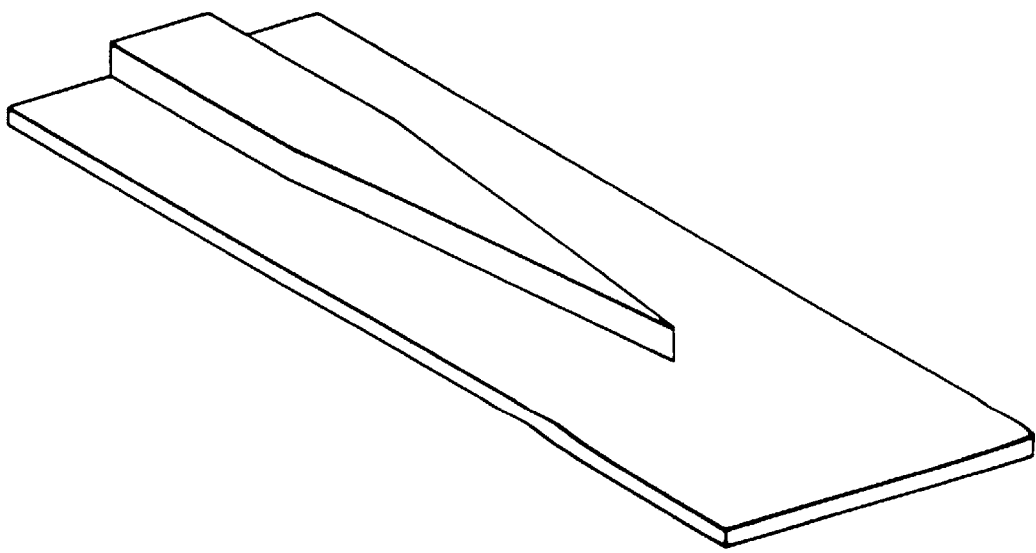
FIG. 11 shows a schematic diagram for the design of a composite waveguide structure having a passive planar waveguide underlying an active tapered waveguide.

In order to improve the alignment tolerances in aligning the optical fibre 2 with the semiconductor laser diode 1, it is proposed that waveguide designs for waveguide 8 are fabricated which incorporate composite waveguides designed to increase the mode size of the guided mode when propagating from the back facet 5 to the front facet 6. Such a composite waveguide structure is shown in FIG. 11.

The LI characteristics shown in FIG. 5 clearly overcome all the deficiencies identified in the prior art LI characteristics shown in FIG. 2. However, given the envisaged operating environment, it is expected that even FGLs according to an embodiment of the present invention would experience mode hops and power jumps at some point during the lifetime of the device, if not on a regular basis. In fact laser mode hops are very difficult to avoid if an operating temperature range of around 50° C. is specified without any temperature control. The wavelength jumps observed using a laser according to an embodiment of the present invention were found to be ~0.05 nm on varying the device temperature (the size of jump is determined by the free spectral range of the laser cavity). The jumps between the external cavity modes are much smaller than those previously described for prior art FGLs where the front facet reflection is dominant. The power variations between mode jumps are also much smaller than those observed in FGLs. Apart from the regions of mode hopping the laser according to an embodiment of the present invention maintains single frequency operation under all conditions, except for currents in excess of 95 mA where areas of multi-mode operation are observed.

Figure 12:
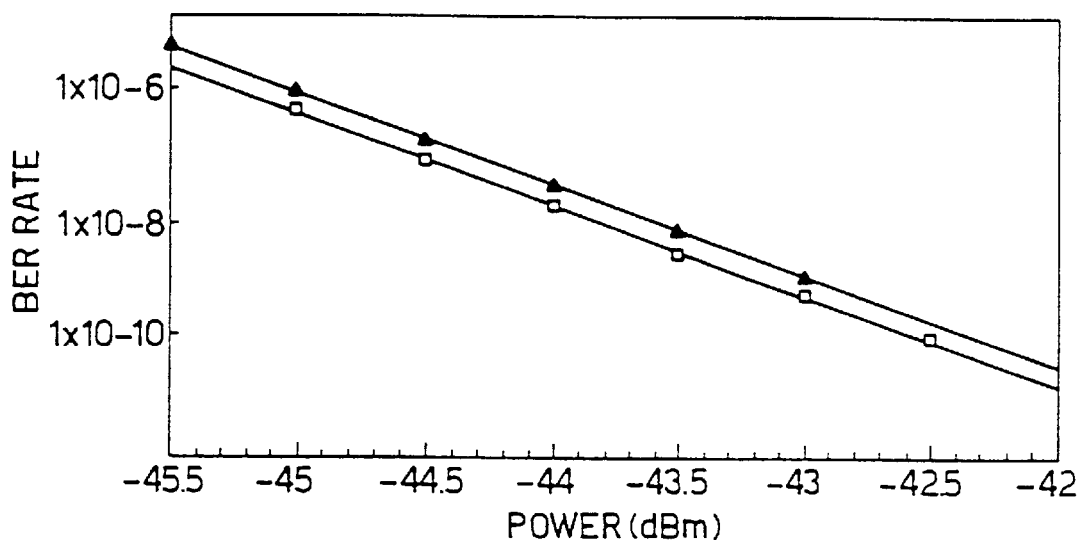
FIG. 12 shows BER measurements of a laser according to an embodiment of the present invention, both back to back (squares), and over 40 km of fibre (triangles) at 155 Mbit/sec.

Typical BER measurements for a FGL according to an embodiment of the present invention are shown in FIG. 12 for the case of operating the device in a stable single mode region of its characteristics. The device performance, both in back to back measurements and over 40 km of fibre, easily meet the envisaged system requirements and are comparable to those of a DFB laser.

A series of BER experiments were also carried out where the temperature of the device was swept across a range known to contain a mode jump. The temperature was ramped repeatedly throughout each measurement in order to simulate a worst case operating environment. On comparison with results for a constant temperature BER result, only a slight deterioration in the BER was caused by the jump between the two modes. Typically a BER of $1 \times 10^{-9}$ at constant temperature would increase to $6 \times 10^{-9}$ when scanning the temperature, this size of variation can easily accommodated within the power budget of the network.

What is claimed is:

1. A laser comprising first and second feedback elements defining a laser cavity, and a gain medium within the laser cavity, the gain medium having first and second facets and an optical waveguide for guiding optical radiation between said first and second facets, wherein the second feedback element is wavelength selective, the optical waveguide comprises a curved section and is configured to direct optical radiation at an angle to the normal of the second facet, and wherein the optical waveguide is additionally configured to direct optical radiation substantially an parallel to the normal bf the first facet.

2. A laser as claimed in claim 1, wherein the first feedback element is provided by a reflective coating on said first facet.

3. A laser as claimed in claim 1, wherein the path of the optical waveguide comprises a first substantially straight section adjacent the first facet, and a second substantially straight section adjacent the second facet and wherein the curved section lies between said straight sections.

4. A laser as claimed in claim 1, wherein the angle between the optical waveguide and the normal of the second facet is greater than 5°.

5. A laser as claimed in claim 1, wherein the angle between the optical waveguide and the normal of the second facet is greeter than 10°.

6. A laser as claimed in claim 1, wherein the angle between the optical waveguide and the normal of the second facet is approximately 12°.

7. A laser as claimed in claim 1, wherein the radius of curvature of the curved section of the optical waveguide is between 0.3 mm and 1 mm.

8. A laser as claimed in claim 1, wherein the wavelength selective feedback element comprises a grating.

9. A laser as claimed in claim 9, wherein the grating is within an optical fibre.

10. A laser as claimed in claim 9, wherein the end of the optical fibre adjacent the second facet of the gain medium is a cleaved end.

11. A laser as claimed in claim 10, wherein the normal to the plane of the cleave of the fibre is at an angle to the fibre axis.

12. A laser as claimed in claim 9, wherein the end of the optical fibre adjacent the second facet comprises a lens.

13. A laser as claimed in claim 1, wherein the first feedback element is provided by the first facet of the gain medium.

14. A laser as claimed in claim 1, wherein the second facet of the gain medium comprises an anti-reflection coating.

15. A laser as claimed in claim 1, wherein the optical waveguide supports two modes having orthogonal polarisations, and is dimensioned so as to provide more gain to one mode than to the other mode.

16. A laser as claimed in claim 1, wherein the gain medium is a semiconductor laser diode.

17. A laser as claimed in claim 16, wherein the optical waveguide comprises a waveguide structure which modifies the size of a mode of the waveguide as it propagates from the first facet to the second facet of the gain medium.

18. A laser as claimed in claim 17, wherein the semiconductor laser diode comprises a composite optical waveguide having a first optically passive planar waveguide and a second optically active waveguide, and wherein said second waveguide is tapered, in a direction substantially parallel to the plane of said first waveguide, along a substantial part of the length of the second waveguide towards the second facet of the semiconductor laser diode, so that the size of the fundamental optical mode supported by the composite waveguide increases along the length of the composite waveguide towards the second facet.

* * * * *